(12) United States Patent
Chen et al.

(10) Patent No.: US 7,064,396 B2
(45) Date of Patent: Jun. 20, 2006

(54) INTEGRATED CIRCUIT WITH MULTIPLE SPACER INSULATING REGION WIDTHS

(75) Inventors: Jian Chen, Austin, TX (US); Vance H. Adams, Austin, TX (US); Choh-Fei Yeap, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 119 days.

(21) Appl. No.: 10/790,420

(22) Filed: Mar. 1, 2004

(65) Prior Publication Data

US 2005/0190421 A1 Sep. 1, 2005

(51) Int. Cl.
*H01L 29/94* (2006.01)
*H01L 31/062* (2006.01)

(52) U.S. Cl. ............ 257/369; 257/338; 257/351; 438/199

(58) Field of Classification Search .......... None
See application file for complete search history.

(56) References Cited

U.S. PATENT DOCUMENTS

| | | | |
|---|---|---|---|
| 5,461,243 A | 10/1995 | Ek et al. | |
| 5,580,804 A * | 12/1996 | Joh | 438/231 |
| 5,759,898 A | 6/1998 | Ek et al. | |
| 5,846,857 A | 12/1998 | Ju | |
| 5,943,565 A | 8/1999 | Ju | |
| 6,316,302 B1 * | 11/2001 | Cheek et al. | 438/199 |
| 6,369,438 B1 | 4/2002 | Sugiyama et al. | |
| 6,512,273 B1 * | 1/2003 | Krivokapic et al. | 257/369 |
| 6,524,935 B1 | 2/2003 | Canaperi et al. | |
| 6,847,080 B1 * | 1/2005 | Komori et al. | 257/344 |
| 2002/0164847 A1 * | 11/2002 | Kim et al. | 438/199 |
| 2003/0013305 A1 | 1/2003 | Sugii et al. | |
| 2003/0034529 A1 | 2/2003 | Fitzgerald | |
| 2003/0040160 A1 | 2/2003 | Huang et al. | |

(Continued)

FOREIGN PATENT DOCUMENTS

JP 2000243946 12/1999

(Continued)

OTHER PUBLICATIONS

Chi et al., "Electrically active defects in surface preamorphized and subsequently RTP-annealed Si and the effect of titanium silicidation," *Proc. 1998 5th International Conference on Solid-State and Integrated Circuit Technology*,, Oct. 21, 1998, Beijing, China, p. 324-327.

(Continued)

*Primary Examiner*—Tu-Tu Ho
(74) *Attorney, Agent, or Firm*—David G. Dolezal; James I. Clingan, Jr.

(57) ABSTRACT

An integrated circuit with both P-channel transistors (823) and N-channel transistors (821) with different spacer insulating region widths. In one example, the outer sidewall spacer (321) of the N-channel transistors is removed while the P-channel regions (115) are masked such that the spacer insulating region widths of the N-channel transistors is less than the spacer insulating region widths of the P-channel transistors. Also, the drain/source silicide regions (805) of the N-channel transistors are located closer to the gates (117) of those transistors than the P-channel source/drain suicide regions (809) are located to the gates (119) of those transistors. Providing the P-channel transistors with greater spacer insulating widths and greater distances between the source/drain silicide regions and gates may increase the relative compressive stress of the channel region of the P-channel transistors relative the stress of the channel region of the N-channel transistors, thereby increasing the performance of the P-channel transistors.

15 Claims, 5 Drawing Sheets

U.S. PATENT DOCUMENTS

2004/0014305 A1* 1/2004 Haselden et al. ............ 438/585
2005/0020022 A1* 1/2005 Grudowski ................. 438/305

FOREIGN PATENT DOCUMENTS

WO      WO 02/33746 A1     4/2002

OTHER PUBLICATIONS

Fahey et al., "Point defects and dopant diffusion in silicon," *Reviews of Modern Physics*, Apr. 1989, vol. 61, No. 2, pp. 289-384.

Lee et al., "Sub-30 nm P+ abrupt junction formation in Strained Si/$Si_{1-x}Ge_x$ MOS device," *Technical Digest of the International Electron Devices Meeting*, Dec. 8, 2002, pp. 379-381.

LeGoues et al., "Kinetics and Mechanism of Oxidation of SiGe: Dry Versus Wet Oxidation," *Applied Physics Letters*, Feb. 13, 1989, vol. 54, No. 7, pp. 644-646.

LeGoues et al., "Oxidation Studies of SiGe," *Journal of Applied Physics*, Feb. 15, 1989, vol. 65, No. 4, pp. 1724-1728.

Lim et al., "Dry Thermal Oxidation of a Graded SiGe Layer," *Applied Physics Letters*, Nov. 26, 2001, vol. 79, No. 22, pp. 3606-3608.

Sawano et al., "Relaxation Enhancement of SiGe Thin Layers by Ion Implantation into Si Substrates," *IEEE*, 2002, pp. 403-404.

Tezuka et al., "Dislocation-free Formation of Relaxed SiGe-on-insulator Layers," *Applied Physics Letters*, May 13, 2002, vol. 80, No. 19, pp. 3560-3562.

Tezuka et al., "Fabrication of Strained Si on an Ultrathin SiGe-on-insulator Virtual Substrate with a High-Ge Fraction," *Applied Physics Letters*, Sep. 17, 2001, vol. 79, No. 12, pp. 1798-1800.

Vyatkin et al., "Ion Beam Induced Strain Relaxation in Pseudomorphous Epitaxial SiGe Layers," *IEEE*, 2000, pp. 70-72.

U.S. Appl. No. 10/670,928, filed Sep. 25, 2003, entitled "SOI Template Layer", same assignee as assignee hereof.

* cited by examiner

INTEGRATED CIRCUIT WITH MULTIPLE SPACER INSULATING REGION WIDTHS

BACKGROUND OF THE INVENTION

1. Field of the Invention

This invention relates in general to integrated circuits.

2. Description of the Related Art

Some integrated circuits utilize N-channel transistors and P-channel transistors having spacer insulating regions adjacent to the gates of these transistors. Typically, the spacer insulating regions are the same width for both the N-channel transistors and the P-channel transistors.

The stress of the lattice of a transistor channel may affect performance of a P-channel transistor differently than that of an N-channel transistor. Typically, increased compressive stress (or reduced tensile stress) on a channel lattice will improve the performance (e.g. improved drive current) of a P-channel transistor but decrease the performance of an N-channel transistor.

What is needed is an integrated circuit with improved performance for both N-channel and P-channel transistors.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The structures shown in the Figures are not necessarily drawn to scale.

DETAILED DESCRIPTION

The following sets forth a detailed description of a mode for carrying out the invention. The description is intended to be illustrative of the invention and should not be taken to be limiting.

FIGS. 1–8 show partial cross sectional views of one embodiment of various stages of a wafer in the manufacture of an integrated circuit having a P-channel transistor with an overall spacer insulating region width greater than that of an N-channel transistor. With some embodiments, this greater width may provide for a greater compressive channel stress or lesser tensile channel stress of the P-channel transistor than that for the N-channel transistor.

Figure 1:
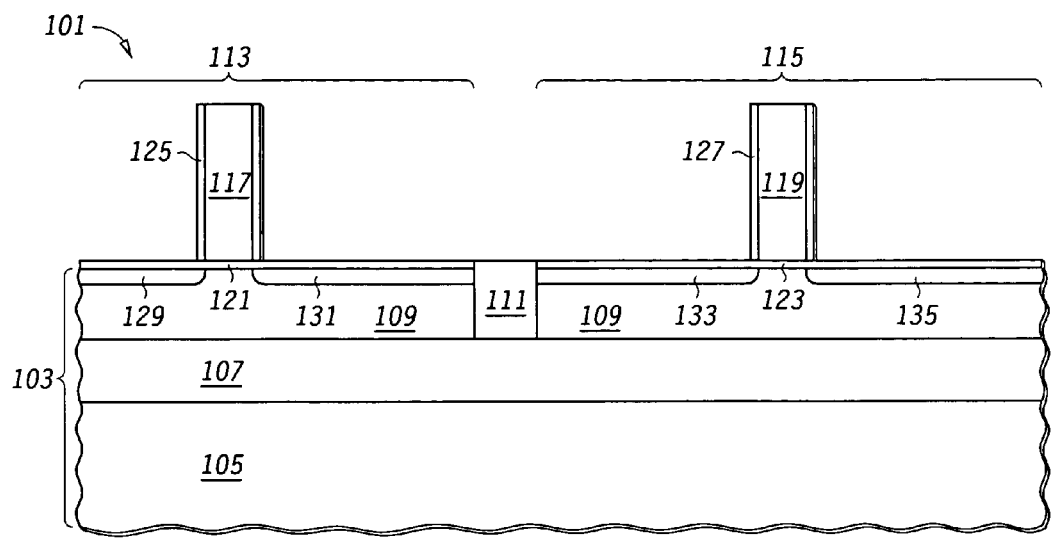
FIG. 1 is a partial cross sectional view of one embodiment of a wafer during a stage in the manufacture of an integrated circuit according to the present invention.

FIG. 1 is a partial cross sectional view of a wafer 101 having an N-channel region 113 and a P-channel region 115. In the embodiment shown, wafer 101 includes a silicon layer 109 located on an insulative layer 107 (e.g. $SiO_2$). The insulative layer 107 is located on a silicon substrate 105. An isolation trench 111 is formed in layer 109 to isolate the N-channel region 113 from the P-channel region 115 in layer 109. Layer 109 in P-channel region 115 is doped with an N-type conductivity dopant (N-type dopant) (e.g. arsenic, phosphorous), and layer 109 in the N-channel region is doped with a P-type conductivity dopant (P-type dopant) (e.g. boron, $BF_2$).

Wafer 101 includes a gate dielectric 121 located on silicon layer 109 in N-channel region 113 and a gate dielectric 123 located on silicon layer 109 in P-channel region 115. In one embodiment, dielectrics 121 and 123 have the same thicknesses and were thermally grown from layer 109 after the formation of trench 111. However, in other embodiments, dielectrics 121 and 123 may have different thicknesses. Also in other embodiments, dielectrics 121 and 123 may be formed by different processes.

A gate 117 is formed on dielectric 121 in N-channel region 113 and a gate 119 is formed on dielectric 123 in P-channel region 115. In one embodiment, gates 117 and 119 are formed by depositing a layer (not shown) of polysilicon over wafer 101, doping the layer in the N-channel region 113, and then patterning the layer. Wafer 101 may include other gates in other P-channel regions and N-channel regions not shown in the Figures. In other embodiments, the gates may be made of other materials, e.g. metal.

After the formation of gates 117 and 119, a thin sidewall spacer 125 is formed on gate 117 and a thin sidewall spacer 127 is formed on gate 119. In one embodiment, spacers 125 and 127 are formed by depositing a layer of silicon dioxide by chemical vapor deposition (CVD) followed by subsequent patterning. In some embodiments, spacers 125 and 127 range in thickness from 60–150 angstroms. In other embodiments, spacers 125 and 127 may be formed by other methods, have other thicknesses, and/or be made of other materials.

After the formation of spacers 125 and 127, dopants are implanted into layer 109 that will be later used to form source/drain extensions. In one embodiment, an N-type dopant (e.g. arsenic, phosphorous) is implanted to into regions 129 and 131 while P-channel region 115 is masked. In some embodiments, halo implants of P-type dopants (e.g. Boron, $BF_2$) are implanted in layer 109 of N-channel region 113 as well. In one embodiment, the extension implants are vertical implants, but in other embodiments, may be angled implants. In some embodiments, the extension implants may include vertical implants followed by angled implants angled from the source side.

Regions 133 and 135 are doped with P-type dopants (e.g. boron, $BF_2$) by e.g. ion implantation while N-channel region 113 is masked. In some embodiments, halo implants of N-type dopants (e.g. arsenic, phosphorous) may also be made. The extension implants may be vertical and/or angled implants.

Figure 2:
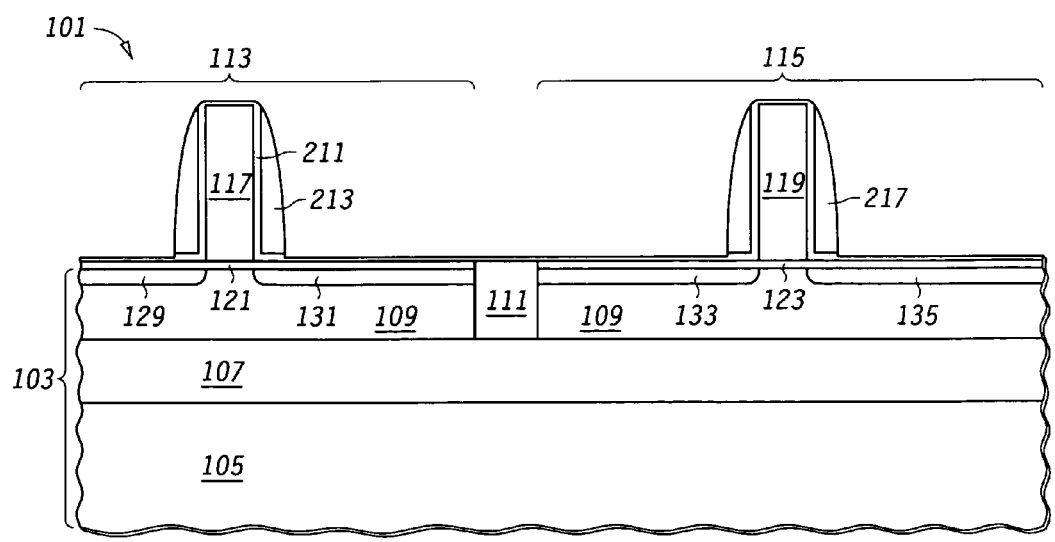
FIG. 2 is a partial cross sectional view of one embodiment of a wafer during another stage in the manufacture of an integrated circuit according to the present invention.

FIG. 2 is a partial cross sectional side view of wafer 101 after a sidewall spacer 213 has been formed next to gate 117 and a sidewall spacer 217 has been formed next to gate 119. In the embodiment shown, a dielectric 211 (e.g. CVD deposited silicon oxide) is deposited over wafer 101 as a liner prior to the formation of spacers 213 and 217. In one embodiment, dielectric 211 has a thickness in the range of 60–200 angstroms (e.g. 80 angstroms). Dielectric 211 is formed on spacers 125 and 127, which are not shown in FIG. 2 (or in subsequent Figures).

A layer of spacer material (e.g. nitride, oxide, silicon oxynitride) is deposited on dielectric 211 (e.g. by a CVD type process). In one embodiment, the layer of spacer material may have a thickness ranging from 300 angstroms to 700 angstroms, but may be of other thicknesses in other embodiments. Wafer 101 is then subjected to a dry etch that results in spacers 213 and 217 remaining from the layer of spacer material. During the dry etch, the thickness of the exposed portion of dielectric 211 is also reduced. In other embodiments, spacers 213 and 217 may be formed by other processes and/or be made of other materials. For example, spacers 213 and 217 may be made from other materials that are selectably etchable from the liners. In some embodiments, spacers 213 and 217 at their bases have a width in the range of 200–500 angstroms, but may be of other widths in other embodiments.

Figure 3:
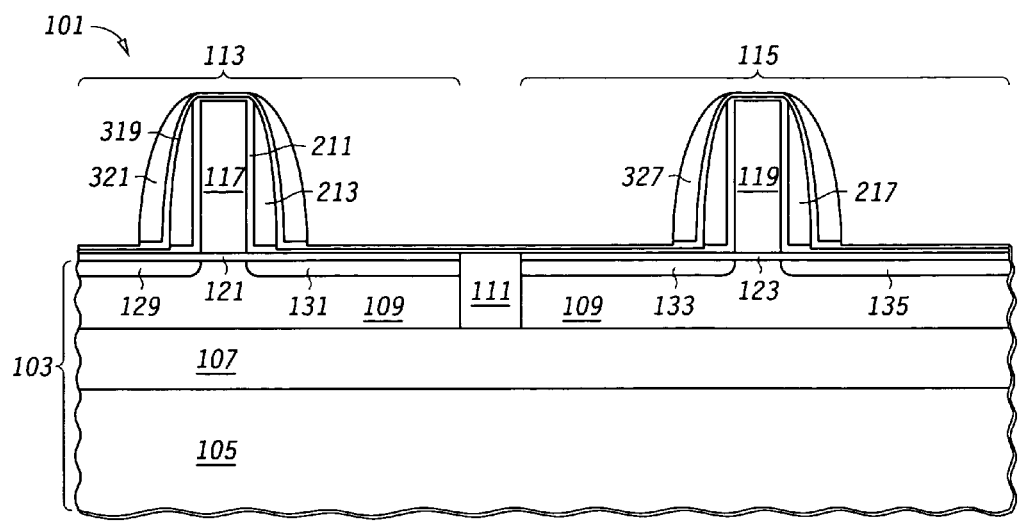
FIG. 3 is a partial cross sectional view of one embodiment of a wafer during another stage in the manufacture of an integrated circuit according to the present invention.

FIG. 3 is a partial cross sectional side view of wafer 101 after sidewall spacer 321 has been formed adjacent to spacer 213 and sidewall spacer 327 has been formed adjacent to spacer 217. In the embodiment shown, a dielectric 319 (e.g. CVD deposited silicon oxide) is deposited over wafer 101 as a liner. In one embodiment, dielectric 319 has a thickness in the range of 60–200 angstroms. A layer of spacer material (e.g. nitride, oxide, silicon oxynitride) is deposited on dielectric 319. The wafer is then subjected to dry etch that results in spacers 321 and 327 remaining from the layer of spacer material. During the dry etch, the thickness of the exposed portion of dielectric 319 is also reduced. In other embodiments, spacers 321 and 327 may be formed by other methods and/or made by other materials. In some embodiments, spacers 321 and 327 at their bases have a width in the range of 200–500 angstroms, but may be of other widths in other embodiments.

Figure 4:
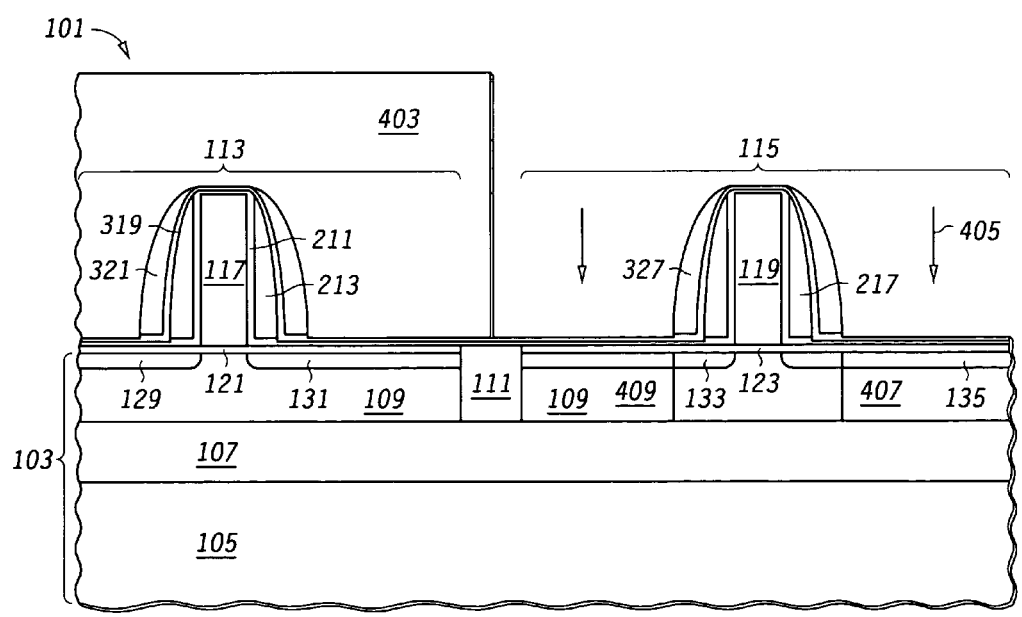
FIG. 4 is a partial cross sectional view of one embodiment of a wafer during another stage in the manufacture of an integrated circuit according to the present invention.

Referring to FIG. 4, a mask 403 is formed over N-channel region 113 to mask region 113. In one embodiment, mask 403 is formed of a patterned layer of photo resist.

Regions 407 and 409 of layer 109 are then implanted with a P-type dopants (e.g. boron, $BF_2$) by ions 405. In one embodiment, the ions are boron ions implanted at an energy of 5–10 KeV. The dopant implanted into regions 409 and 407 will be utilized to form the deep source/drain regions of a P-channel transistor (transistor 823 in FIG. 8) formed in P-channel region 115. Ions 405 may be implanted vertically and/or at an angle.

Figure 5:
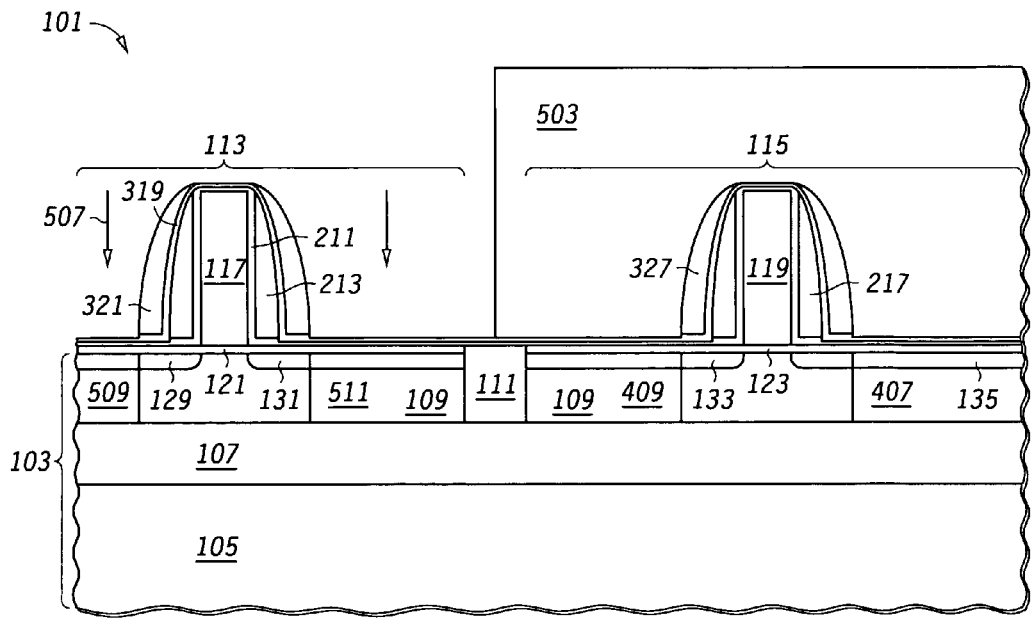
FIG. 5 is a partial cross sectional view of one embodiment of a wafer during another stage in the manufacture of an integrated circuit according to the present invention.

Referring to FIG. 5, mask 403 is removed and a mask 503 is formed over P-channel region 115. Regions 511 and 509 of layer 109 are implanted with N-type dopants (e.g. arsenic, phosphorous) by ions 507. In one embodiment, the ions 507 are phosphorous ions implanted at an energy of 10–20 KeV. The dopant implanted into regions 509 and 511 will be utilized to form the deep source/drain regions of an N-channel transistor (transistor 821 in FIG. 8) formed in N-channel region 115. Ions 507 may be implanted vertically and/or at an angle.

Figure 6:
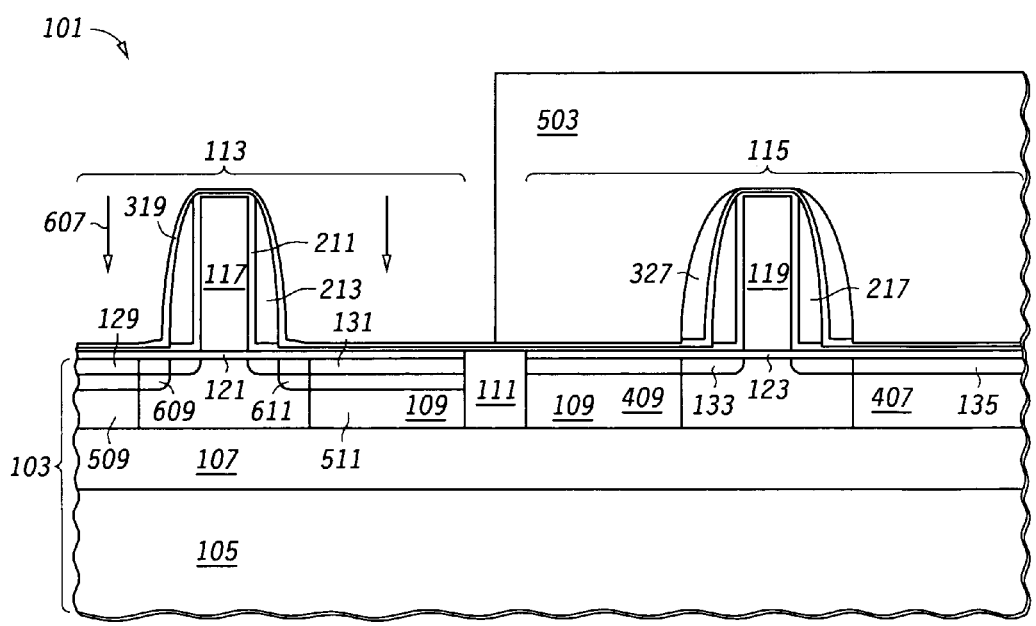
FIG. 6 is a partial cross sectional view of one embodiment of a wafer during another stage in the manufacture of an integrated circuit according to the present invention.

Referring to FIG. 6, after spacer 321 has been removed (e.g. by a dry selective etch), another implant of N-type dopants (e.g. arsenic, phosphorous) is made into regions 609 and 611 of layer 109 by ions 607. The dopants implanted into regions 609 and 611 are utilized to improve the series resistance of the source/drain regions (e.g. 703 and 705 in FIG. 8) of an N-channel transistor (821 in FIG. 8) formed in region 113. In one embodiment, ions 607 are arsenic ions implanted at an energy in the range of 20–50 KeV. Ions 607 may be implanted vertically and/or at an angle.

In other embodiments, ions 507 would be implanted after the removal of spacer 321 where the implanting of ions 607 would be omitted. In other embodiments, the implanting of ions 607 may be omitted.

Figure 7:
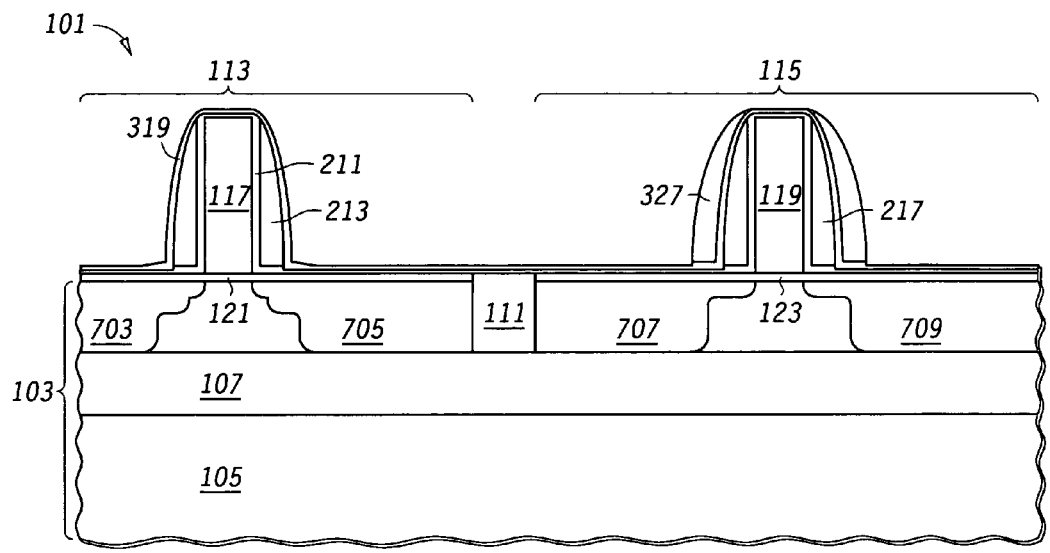
FIG. 7 is a partial cross sectional view of one embodiment of a wafer during another stage in the manufacture of an integrated circuit according to the present invention.

Referring to FIG. 7, after the removal of mask 503, the dopants in layer 109 are activated to form the source/drain regions of the transistors of regions 113 and 115. The dopants in region 509, region 609, and region 129 are activated to form source/drain region 703. The dopants in region 511, region 611, and region 131 are activated to form source/drain region 705. The dopants of region 409 and region 133 are activated to form source/drain region 707, and the dopants of region 407 and region 135 are activated to form source/drain region 709. In one embodiment, the dopants are activated by rapid thermal annealing of wafer 101 at temperatures in the range of 1000–1100 C.

In subsequent processes, wafer 101 is subject to a wet etch to remove exposed remaining portions of dielectric 211 and dielectric 319.

Figure 8:
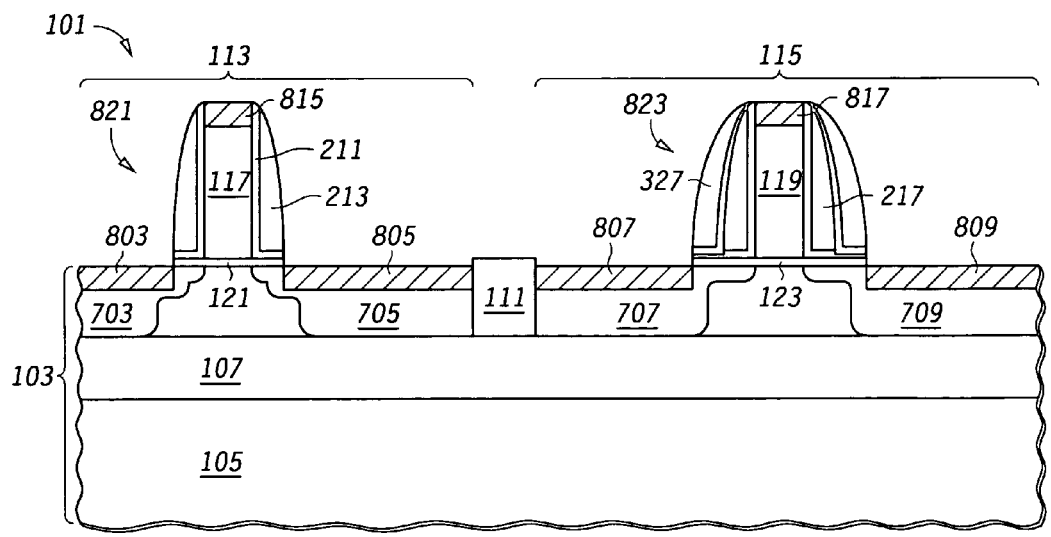
FIG. 8 is a partial cross sectional view of one embodiment of a wafer during another stage in the manufacture of an integrated circuit according to the present invention.

Referring to FIG. 8, silicide region 803 is formed in source/drain region 703, silicide region 805 is formed in source drain region 705, and silicide region 815 is formed in the top portion of gate 117. Silicide region 807 is formed in source/drain region 707, suicide region 809 is formed in source/drain region 709, and silicide region 817 is formed in the top portion of gate 119. In one embodiment, these silicide regions are formed by depositing a metal layer (e.g. cobalt, nickel) over wafer 101 and reacting the metal layer with exposed silicon.

Wafer 101 may include other P-channel transistors with similar spacer insulating region widths and source/drain silicide region to gate distances as that shown and described for transistor 823. Wafer 101 may include other N-channel transistors with similar spacer insulating region widths and source/drain silicide region to gate distances as that shown and described for transistor 821.

In subsequent processes, other structures (not shown) are formed on wafer 101 including e.g. dielectrics, interconnects, and external terminals. The wafer is then signulated into multiple integrated circuits.

As shown in FIG. 8, the distance between gate 117 and silicide region 803 is less than the distance between silicide region 807 and gate 119 due to the removal of spacer 321 (see FIG. 6). Accordingly, the thickness of the spacer insulating region (e.g. sidewall spacer 213 and dielectric 211 in the embodiment shown) of N-type transistor 821 is less than the spacer insulating region (e.g. spacer 327, dielectric 319, spacer 217, and dielectric 211 in the embodiment shown) of P-channel transistor 823.

In some embodiments, the increased width of the spacer insulating region (and increased distance between the source/drain silicide region and the gate) of P-channel transistor 823 acts to provide a relative increase in the compressive stress (or relative decrease in tensile stress) on the channel region of the P-channel transistor relative to the stress on the channel region of N-channel transistor 821. This differential in stress may allow for performance improvement in one or both of the N-channel transistor and P-channel transistor over an integrated circuit having equal spacer insulting region widths for the N-channel and P-channel transistors.

In some embodiments, the difference in spacer insulating region widths between the N-channel transistors and the P-channel may range from 50 angstroms to 1000 angstroms. However, other embodiments, the difference may be of other thicknesses.

Figure 9:
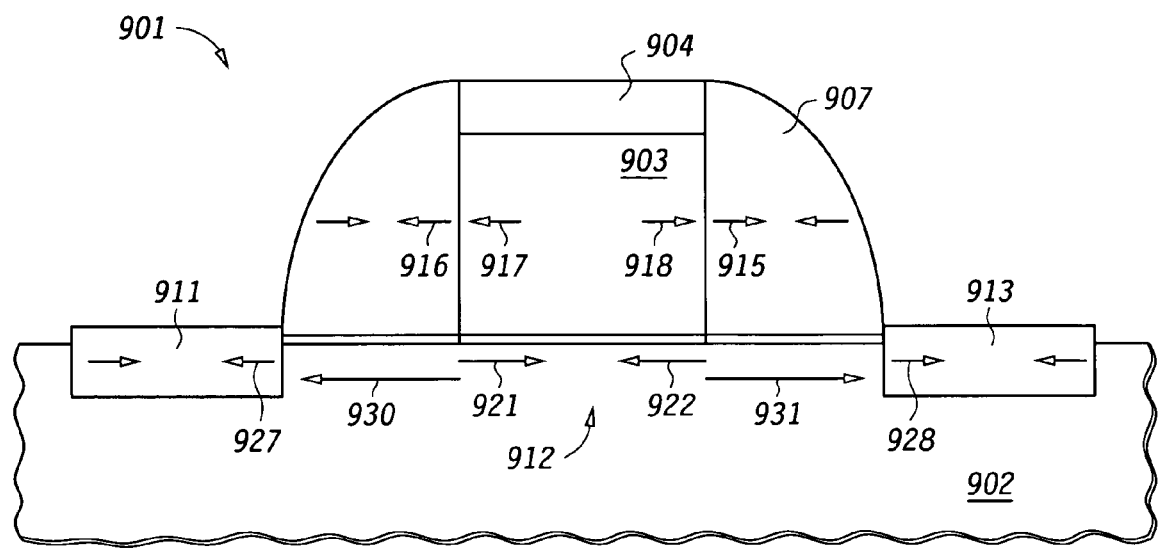
FIG. 9 is a cross sectional view of one embodiment of a transistor illustrating the effects of stress of the structures of the transistor.

FIG. 9 is a cross sectional side view of a transistor showing stresses on transistor structures and their effect on the channel region of the transistor. Transistor 901 includes a spacer insulating region 907 adjacent to gate 903. Region 907 includes at least one spacer and may include one or more liners as well. Silicide region 904 is formed in gate 903 and silicide regions 911 and 913 are located in substrate 902 adjacent to region 907.

In one embodiment, spacer insulating region 907 includes at least one spacer that is tensile due to process induced stresses. For example, a silicon nitride film deposited by a low pressure CVD process may have an intrinsic tensile stress of 750 MPa. This tensile stress acts to provide a force to pull the spacer inward (see arrows 915 and 916). This inward force acts to provide a tensile stress on gate 903 (see arrows 917 and 918). This tensile stress on gate 903 provides a relatively compressive stress on channel 912 (see arrows 921 and 922). Making the width of spacer insulating region 907 wider provides more mass to the region, which may act to increase the tensile stress (as shown by arrows 917 and 918) on gate 903 and thereby increase the relative compressive stress (as shown by arrows 921 and 922) on channel region 912.

In addition, silicide regions 911 and 913 may be tensile due to thermal expansion mismatch between the suicides and the silicon of substrate 902. This tensile stress (as shown by arrows 927 and 928) acts to provide a tensile stress (as shown by arrows 930 and 931) on channel region 912. Increasing the spacing between the source/drain silicide region and the channel region acts to reduce the relative tensile stress on the channel region due the stress of the source/drain silicide region.

Accordingly, providing a transistor with a greater spacer insulating region width and a greater distance from the source/drain silicide region and the channel region may provide a transistor with a relatively more compressed channel region, which may result in improved P-channel transistor performance. Conversely, providing a transistor with a smaller spacer insulating region width and a smaller distance from the source/drain silicide region and the channel region may provide a transistor with a relatively more tensile channel region, which may result in improved N-channel transistor performance.

The ability to differentiate the relative channel stress of the P-channel and N-channel transistors may be advantageous for circuits built in structures (e.g. a wafer with a silicon on insulator configuration) where transistor performance may be channel stress sensitive.

Although the features set forth above have been described for a wafer with a silicon (e.g. 109) on an insulator (e.g. 107) configuration, such features may be implemented with other types of wafers e.g. bulk silicon or wafers having other types of silicon on insulator configurations.

Also, transistors with differences in spacer insulating widths and differences in the distance between the source/drain silicide region and gate may be made by other processes. For example, in some embodiments, P-channel region 115 may be masked (e.g. with mask 503) prior to N-channel region 113 being masked (e.g. with mask 403) wherein spacer 321 would be removed prior to implanting ions 405. Also, in some processes, the spacer insulating region may not include liners.

In other embodiments, a difference in spacer insulating region widths and a difference between a source/drain silicide region and gate may be achieved by making spacers of different widths for the N-channel transistors and the P-channels transistors.

In some embodiments, the thickness of the liner may affect channel stress. In some embodiments, the thinner the liner, the more tensile the channel region. For example, reducing the thickness of dielectric 211 (see FIG. 2) may increase tensile stress in the channel.

In one embodiment of the present invention, an integrated circuit includes a substrate, a first gate of an N-channel transistor over the substrate, a second gate of a P-channel transistor over the substrate, a first spacer insulating region adjacent to the first gate having a first width at its base, and a second spacer insulating region adjacent to the second gate having a second width at its base. The second width is greater than the first width.

In another embodiment of the invention, an integrated circuit includes a substrate, a first gate of an N-channel transistor over the substrate, and a second gate of a P-channel transistor over the substrate. The integrated circuit also includes a first silicide region in the substrate for the N-channel transistor. The first silicide region is a first distance from the first gate. The integrated circuit further includes a second silicide region in the substrate for the P-channel transistor. The second silicide region is a second distance from the second gate. The second distance is greater than the first distance.

In another embodiment of the invention, a method includes providing a substrate and forming, over the substrate, a first gate for an N-channel transistor and a second gate for a P-channel transistor. The method also includes forming a first sidewall spacer for the N-channel transistor lateral to the first gate and a second sidewall spacer for the P-channel transistor lateral to the second gate and forming a third sidewall spacer for the N-channel transistor lateral to the first sidewall spacer and a fourth sidewall spacer for the P-channel transistor lateral to the second sidewall spacer. The method further includes providing a first mask over the first gate and implanting dopants, while the first mask is over the first gate, of a first conductivity type into the substrate, removing the first mask after the implanting the dopants of the first conductivity type, and providing a second mask over the second gate. The method further includes implanting dopants, while the second mask is over the second gate, of a second conductivity type into the substrate and removing the third sidewall spacer while the second mask is over the second gate.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:
   providing a substrate;
   forming, over the substrate, a first gate for an N-channel transistor and a second gate for a P-channel transistor;

forming a first sidewall spacer for the N-channel transistor lateral to the first gate and a second sidewall spacer for the P-channel transistor lateral to the second gate;

forming a third sidewall spacer for the N-channel transistor lateral to the first sidewall spacer and a fourth sidewall spacer for the P-channel transistor lateral to the second sidewall spacer;

providing a first mask over the first gate;

implanting dopants, while the first mask is over the first gate, of a first conductivity type into the substrate;

removing the first mask after the implanting the dopants of the first conductivity type;

providing a second mask over the second gate;

implanting dopants, while the second mask is over the second gate, of a second conductivity type into the substrate;

removing the third sidewall spacer while the second mask is over the second gate;

forming a first silicide region in the substrate for the N-channel transistor, wherein the first silicide region is substantially aligned with the first sidewall spacer; and forming a second silicide region in the substrate for the P-channel transistor, wherein the second silicide region is substantially aligned with the fourth sidewall spacer.

2. The method of claim 1, further comprising:

forming a first liner over the first gate and a second liner over the second gate prior to the forming the first sidewall spacer and the second sidewall spacer, and forming a third liner over the first sidewall spacer and a fourth liner over the second sidewall spacer prior to the forming the third sidewall spacer and the fourth sidewall spacer.

3. The method of claim 2 wherein:

the third liner is of a first material;

the third sidewall spacer is of a second material that is selectably eatable from the first material.

4. The method of claim 3 wherein the first material includes an oxide and the second material includes a nitride.

5. The method of claim 1, wherein the first sillicide region is a first distance from the first gate and wherein the second silicide region is a second distance from the second gate, wherein the second distance is greater than the first distance.

6. The method of claim 1, wherein the providing the first mask occurs prior to the providing the second mask.

7. The method of claim 1, wherein the providing the first mask occurs after the providing the second mask.

8. The method of claim 1 further comprising:

implanting dopants in a first region and a second region of the substrate of the second conductivity type for forming a first extension and a second extension for the N-channel transistor, respectively; and implanting dopant in a third region and a fourth region of the substrate of the first conductivity type for forming a third extension and a fourth extension for the P-channel transistor, respectively.

9. The method of claim 8, wherein:

the implanting dopants in the substrate of the second conductivity type are utilized to form a first doped region and a second region in the substrate that are in contact with the first extension and second extension, respectively; and the implanting dopants of the first conductivity type are utilized to form a third doped region and a fourth doped region in the substrate in contact with the third extension and the fourth extension, respectively.

10. The method of claim 1, further comprising implanting dopants, while the second mask is over the second gate and after removing the third sidewall spacer, of the second conductivity type into the substrate.

11. The method of claim 1, wherein the first gate comprises polysilicon.

12. The method of claim 1, wherein the first gate comprises a metal.

13. The method of claim 1, wherein the substrate is characterized as having a silicon on an insulator configuration.

14. The method of claim 1 wherein:

the forming the first side wall spacer and the second sidewall spacer further includes depositing a first layer of spacer material over the substrate and etching the first layer with a dry etch;

the forming the third side wall spacer and the fourth sidewall spacer further includes depositing a second layer of spacer material over the substrate and etching the second layer with a dry etch.

15. The method of claim 14 wherein the first layer and the second layer include nitride.

* * * * *

UNITED STATES PATENT AND TRADEMARK OFFICE
CERTIFICATE OF CORRECTION

PATENT NO. : 7,064,396 B2 Page 1 of 1
APPLICATION NO. : 10/790420
DATED : June 20, 2006
INVENTOR(S) : Jian Chen It is certified that error appears in the above-identified patent and that said Letters Patent is hereby corrected as shown below:

In Column 7, Line 36, Claim No. 3:
Change "eatable" to --etchable--

In Column 8, Line 6, Claim No. 8:
Change "dopant" to --dopants--

Signed and Sealed this

Twelfth Day of August, 2008

JON W. DUDAS
*Director of the United States Patent and Trademark Office*